(12) United States Patent
Anzaki et al.

(10) Patent No.: US 6,328,857 B1
(45) Date of Patent: Dec. 11, 2001

(54) METHOD FOR FORMING COATING ON SUBSTRATE AND SPUTTERING APPARATUS USED FOR THE METHOD

(75) Inventors: Toshiaki Anzaki; Etsuo Ogino, both of Osaka (JP)

(73) Assignee: Nippon Sheet Glass Co., Ltd., Osaka (JP)

( * ) Notice: Subject to any disclaimer, the term of this patent is extended or adjusted under 35 U.S.C. 154(b) by 0 days.

(21) Appl. No.: 09/632,617

(22) Filed: Aug. 4, 2000

(30) Foreign Application Priority Data

Aug. 5, 1999 (JP) .................................... 11-222577

(51) Int. Cl.[7] .................................... C23C 14/34
(52) U.S. Cl. ............................... 204/192.12; 204/298.06; 204/298.12; 204/298.14; 204/298.26
(58) Field of Search .................. 204/192.12, 298.06, 204/298.08, 298.12, 298.14, 298.26

(56) References Cited

U.S. PATENT DOCUMENTS 5,611,899 * 3/1997 Maass .............................. 204/298.08
6,096,174 * 8/2000 Teschner et al. ............... 204/192.12
6,103,320 * 8/2000 Matsumoto et al. ................. 427/535

OTHER PUBLICATIONS

Merriam Webster's Collegiate Dictionary, Tenth Edition, 1996, p. 14.*

* cited by examiner

Primary Examiner—Nam Nguyen
Assistant Examiner—Steven H. VerSteeg
(74) Attorney, Agent, or Firm—Sughrue, Mion, Zinn Macpeak & Seas, PLLC

(57) ABSTRACT

Sputtering method and apparatus for forming a coating on both sides of a flat substrate or on the entire surface of a bulky substrate without involving rotation of the substrate. At least one pair of sputtering cathodes each having a target attached thereto are arranged in a film-forming chamber capable of controlling a vacuum atmosphere with their target sides facing each other, and a substrate is disposed in front of the targets. A voltage is applied to the sputtering cathodes in such a manner that the polarity alternates between the sputtering cathodes making the pair to induce a glow discharge between the sputtering cathodes. The target on each sputtering cathode is thereby sputtered and deposited on the substrate.

6 Claims, 5 Drawing Sheets

METHOD FOR FORMING COATING ON SUBSTRATE AND SPUTTERING APPARATUS USED FOR THE METHOD

FIELD OF THE INVENTION

This invention relates to a method for forming a coating on an entire surface of a substrate by sputtering in a vacuum apparatus equipped with a film-forming chamber capable of controlling a vacuum atmosphere, and a sputtering apparatus used to carry out the method.

BACKGROUND OF THE INVENTION

A sputtering technique has conventionally been attempted in which two sputtering cathodes having a target attached thereto are adjacently arranged and a coating comprising the target material is formed on a substrate moving in one direction in front of the targets. In this case, a method has been employed that power sources for applying a negative voltage to the two cathodes are provided with respect to the respective sputtering cathode, and a negative voltage is applied to each cathode through electrically separate lines.

This technique has recently developed into a DMS method in which an inversion voltage is alternately applied to the two sputtering cathodes adjacently arranged and while destaticizing the targets, a coating is formed on the substrate moving in one direction in front of the targets. The DMS method is used as a method suitable to high-rate sputtering.

In order to cover the entire surface of a bulky substrate or both sides of a flat plate-like substrate simultaneously with a coating, the sputtering apparatus must be provided with a driving part so as to coat the substrate while rotating the substrate. On the other hand, electron beam deposition or arc plasma ion plating which achieves a high coating rate and can coat a wide area has problems such that the substrate material to be coated is limited and the composition of the coating is deviated from that of the evaporation material because a component or an element, having different vapor pressure has a different rate of evaporation. It has therefore been demanded to develop a sputtering technique and an apparatus therefor that can form a coating on the entire surface of a substrate by a sputtering method which is relatively free from those problems.

SUMMARY OF THE INVENTION

The present invention has been made to overcome the above-described conventional problems.

One object of the present invention is to provide a method for forming a coating of various metal oxides, nitrides, etc., on the entire surface of a bulky substrate or on both sides of a flat plate-like substrate at a high rate.

Another object of the present invention is to provide a sputtering apparatus for carrying out the coating formation method.

According to one embodiment of the present invention, there is provided a method for forming a coating on a substrate, which comprises setting at least one pair of sputtering cathodes as coating cathodes in a film-forming chamber capable of controlling a vacuum atmosphere and applying a voltage to each pair of the sputtering cathodes by alternately inverting their polarities such that when one cathode functions as a cathode, another cathode functions as an anode, and when the another cathode functions as a cathode, the one cathode functions as an anode, sputtering targets attached to the coating cathodes by a glow discharge induced between the two sputtering cathodes of the one pair of coating cathodes, and forming a coating on a substrate disposed substantially in front of the targets attached to the coating cathodes.

According to the present invention, the coating can be formed on both sides of a flat plate-like substrate at the same time. Since the polarity of the potential applied to each sputtering cathode alternates between positive and negative, the target surface is always destaticized even where the target is an electrically insulating substance such as a metal oxide, and as a result, electrification phenomenon does not occur. This enables both sides of a substrate to be simultaneously coated with an insulating metel oxide film. Further, even where the substrate has a bulky shape, such as a spherical shape or a columnar shape, a coating can be formed over the entire surface of the substrate.

DETAILED DESCRIPTION OF THE INVENTION

For the sake of convenience, arrangement of two or more pairs of sputtering cathodes will be explained by referring to an imaginary rectangular parallelepiped made in a film-forming chamber.

Where two pairs of sputtering cathodes are used, it is preferred that a first pair be arranged along two opposite sides of the imaginary rectangular parallelepiped with their target sides facing each other, a second pair be arranged along other two opposite sides of the imaginary rectangular parallelepiped with their target sides facing each other, and a substrate to be coated be placed inside the imaginary rectangular parallelepiped. According to this embodiment, a coating film can be formed over the entire surface of a bulky substrate simultaneously.

A third pair of sputtering cathodes can be added to the above-described arrangement. The third pair can be set in the third opposite sides of the imaginary rectangular parallelepiped with their target sides facing each other. Addition of the third pair makes the coating film thickness more uniform.

In another embodiment of using three pairs of sputtering cathodes, each pair may be arranged along two adjacent sides of the imaginary rectangular parallelepiped with their target sides facing inside, and a substrate is placed inside the rectangular parallelepiped as if it was surrounded by six sputtering cathodes.

All the targets attached to one or more than one pair of sputtering targets usually have the same composition.

The sputtering apparatus according to the present invention comprises a film-forming chamber equipped with a means capable of controlling vacuum atmosphere, a substrate support disposed in the film-forming chamber, at least one pair of sputtering cathodes having a target attached thereto, the target side of each sputtering cathode facing a substrate held on the substrate support, and a means for applying a voltage to the sputtering cathodes in a manner such that the polarity alternates between the sputtering cathodes making the pair to induce a glow discharge to thereby sputter the target to form a coating comprising the target material on the surface of the substrate.

Figure 1:
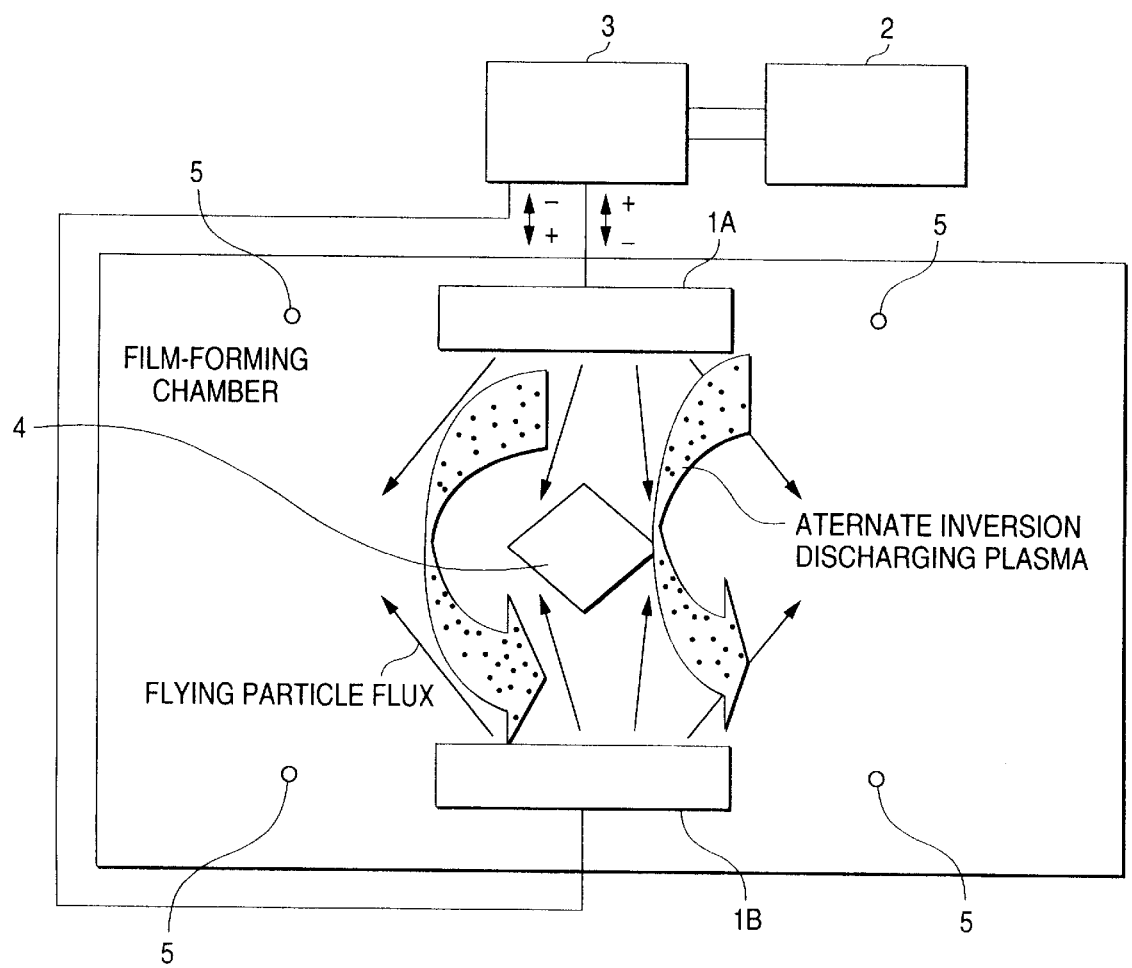
FIG. 1 is a schematic cross section of one practical embodiment of a film-forming chamber in the sputtering apparatus of the present invention.

FIG. 1 is a schematic cross section of one practical embodiment of the film-forming chamber in the sputtering apparatus. The film-forming chamber may connect a substrate loader (not shown) and/or a substrate unloader (not shown) via a gate valve. The film-forming chamber has a vacuum pump (not shown) for creating a vacuum and a gas flow controller (not shown) for controlling the gas composition in the vacuum atmosphere as a means for controlling the vacuum atmosphere. A gas is passed through the gas flow controller (e.g., a mass flow controller) and introduced into the film-forming chamber through four gas introducing pipes 5 provided in the film-forming chamber.

In the film-forming chamber shown in FIG. 1, a pair of planar magnetos type sputtering cathodes 1A and 1B are disposed with their target sides facing each other (the target sides are in parallel with the direction perpendicular to the paper face). A substrate 4 is set in the middle between the pair of the sputtering cathodes 1A and 1B in the direction perpendicular to the target sides or diagonally across from the target sides.

The targets, all of which have the same composition except in some special cases, are attached to the sputtering cathodes by metal bonding or a like means. The distance between two targets making a pair is decided appropriately depending on the shortest distance between the target and the substance to be coated and the purpose of coating. It is therefore preferred for the film-forming chamber to have a mechanism for adjusting the distance between cathodes while maintaining the vacuum atmosphere.

A given amount of argon gas is introduced into the film-forming chamber through the mass flow controller from the gas introducing pipes 5 if necessary together with a given amount of a reactive gas, such as oxygen, nitrogen, methane or an alcohol. Simultaneously with the gas supply, the film-forming chamber is evacuated by the vacuum pump to create a vacuum atmosphere of constant vacuum. The vacuum and the gas composition are controlled so as to enable sputtering by means of the vacuum pump, the introduced gas, a pressure-control valve, etc.

On applying a negative voltage from a power source 2 to the cathode 1A or 1B, glow discharge plasma is produced on the target surface to sputter the target on the cathode 1A or 1B. When the cathode 1A is a positive electrode, the cathode 1B is a negative electrode, or vise versa. A sine wave, a pulse wave or a time-asymmetric wave can be used for such voltage application. An arbitrary voltage wave form capable of Fourier development can also be used. Application of voltage with alternating polarities can be carried out with an oscillator (polarity converter) 3.

A DC bias having a polarity common to the cathodes may be applied to the two cathodes at the same time. In this case, the ground potential of the film-forming chamber and the zero potential of the voltage wave form are different.

It is preferred to provide a member for gas retention, prevention of unnecessary deposition and/or film thickness control around the sputtering cathodes, which is effective to prevent sputtered particles from scattering in unnecessary directions and to confine the spread of the glow discharge plasma within the space in the vicinities of the cathodes thereby stabilizing the discharge processing.

A negative voltage is applied to the cathodes 1A and 1B by the power source 2. The polarity of the two cathodes are alternately inverted by the oscillator (polarity converter) 3 so that the cathode 1A may be a negative electrode when the cathode 1B is a positive electrode while the cathode 1A may be a positive electrode when the cathode 1B is a negative electrode, whereby the charges accumulated on each target are eliminated (cleaning effect) In an instant, a negative voltage is applied to one of the two cathodes with a positive voltage being applied to the other to produce discharge plasma which is inverted alternately, whereby the targets on the two cathodes are sputtered simultaneously.

The polarity inversion frequency is preferably 100 Hz to 1 GHz, and more preferably 1 KHz to 100 KHz. If the inversion frequency is smaller than 100 Hz, the destaticizing effect is reduced, making the discharge instable. If the inversion frequency is greater than 1 GHz, the driving stability of the power source is reduced, and a stable discharge is hardly obtainable.

The wave form of the applied voltage is not particularly limited as long as the negative voltage and the positive voltage are well-balanced so as to neutralize the charges on the target surfaces with respect to the time axis. Such wave forms include a sine wave form, a rectangular pulse wave form and a time-asymmetric wave form.

Although sputtering of each target is intermittent when observed microscopically because the polarity of the cathode is inverted at a certain frequency, the two targets are continuously and simultaneously sputtered when observed macroscopically by setting the polarity inversion frequency within the above-described preferred range. As a result, a coating comprising the target material is deposited on the entire surface of the substrate.

According to the present invention, sputtering can be performed while eliminating the charges on the target surface of each sputtering cathode by the inverted potential and inverted current. As a result, coating can be accomplished without being accompanied by abnormal discharges, such as arcing and a corona discharge, which might be triggered by a thermal shock due to dielectric breakdown of the accumulated film by the accumulated charges.

Further, coating proceeds while removing the film accumulated on the erosion region of the targets by the above-described cleaning effect. Since accumulation of an electrically insulating film on the erosion region of the targets is suppressed, the processing is free from suspension of the discharge plasma due to disappearance of an anode in the course of thin film coating, which might occur in formation of an oxide film by use of a general single target.

Where a reactive gas is used in combination with argon gas, it is possible to form a dense film having a different composition from the target composition. For example, a metal oxide or nitride film can be deposited on the entire surface of a substrate by reactive sputtering using a metal target and oxygen gas or nitrogen gas in combination with argon gas. The distance and the positional relationship of the two cathodes and the distance between the substrate and the targets are decided taking the sputtering rate and the like into consideration. If desired, a substrate rotating mechanism may be provided.

The shape of the sputtering cathodes and the targets attached thereto includes a square, a circle, an ellipse and a concentric circle. It is usually preferred for a pair of cathodes to have the same shape to improve the balance of the discharge plasma. Curved targets can also be used as arranged in point symmetry to form a partial hollow sphere in the center of the film-forming chamber. In this case, the cathodes are usually fitted with an enhanced magnet system and a cooling mechanism on their back side. The magnet is not always required, in which case the erosion profile may be planar.

A backing plate mainly comprising copper, a backing plate cooling mechanism, and enhanced magnet for creating a magnetic field are provided on the back of each target either integrally with or separately from the target. In order to increase adhesion between the target and the backing plate, the backing plate usually made of copper is preferably plated with nickel, etc.

The substrate to be coated is held on a substrate support, which may be fixed or rotatable uniaxially, biaxially or triaxially. One or more than one substrates may be put in a rotating container which allows the flux of flying particles of the sputtered target to pass through, such as a cage.

Figure 2:
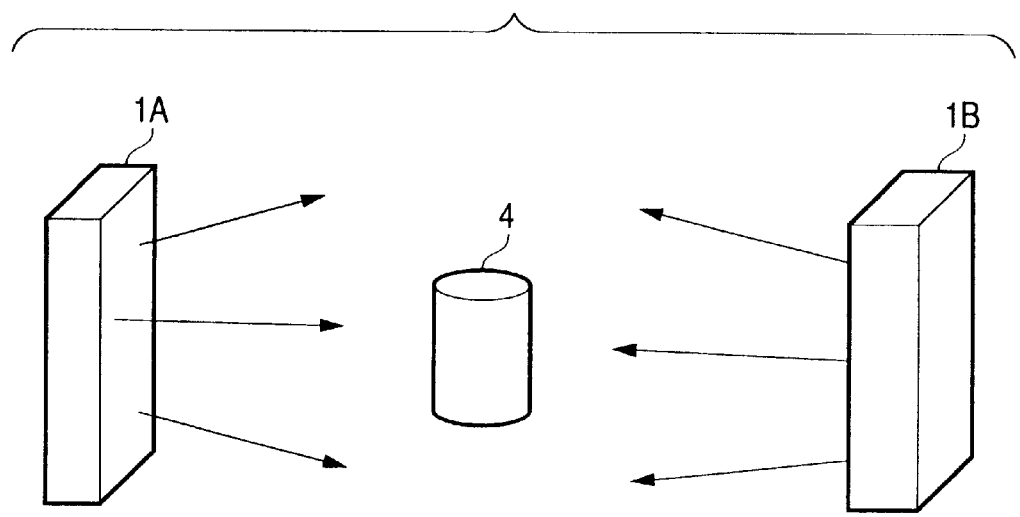
FIG. 2 is a view showing one embodiment of an arrangement of a pair of sputtering cathodes of the present invention.

In FIG. 2, a pair of rectangular parallelopipedonal sputtering cathodes 1A and 1B are arranged with their target sides facing each other, and a circular cylinder 4 (substrate) is set therebetween. In this embodiment, a coating film can be formed on the entire surface, especially the lateral surface, of the substrate 4.

Figure 3:
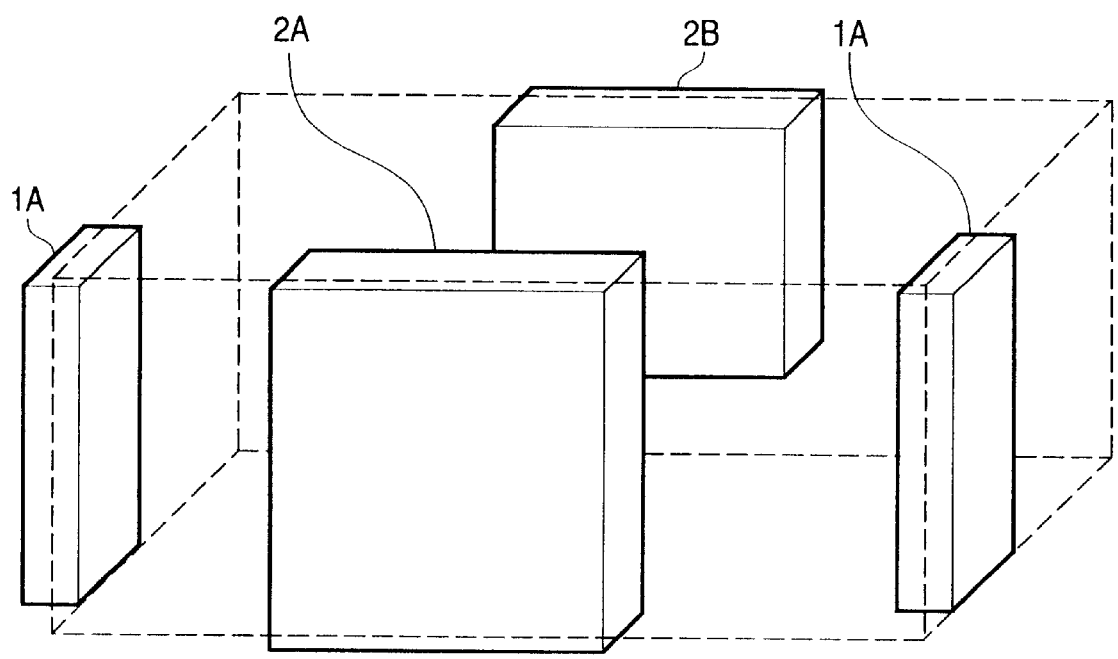
FIG. 3 is a view showing one embodiment of an arrangement of two pairs of sputtering cathodes of the present invention.

FIG. 3 shows an arrangement example of two pairs of rectangular parallelopipedonal sputtering cathodes, i.e., a pair of 1A and 1B and a pair of 2A and 2B, in which the target sides of each pair face each other. The imaginary rectangular parallelepiped, which is used for the sake of convenience for explanation, is shown by dotted lines. A substrate is disposed within the space surrounded by the dotted lines.

Figure 4:
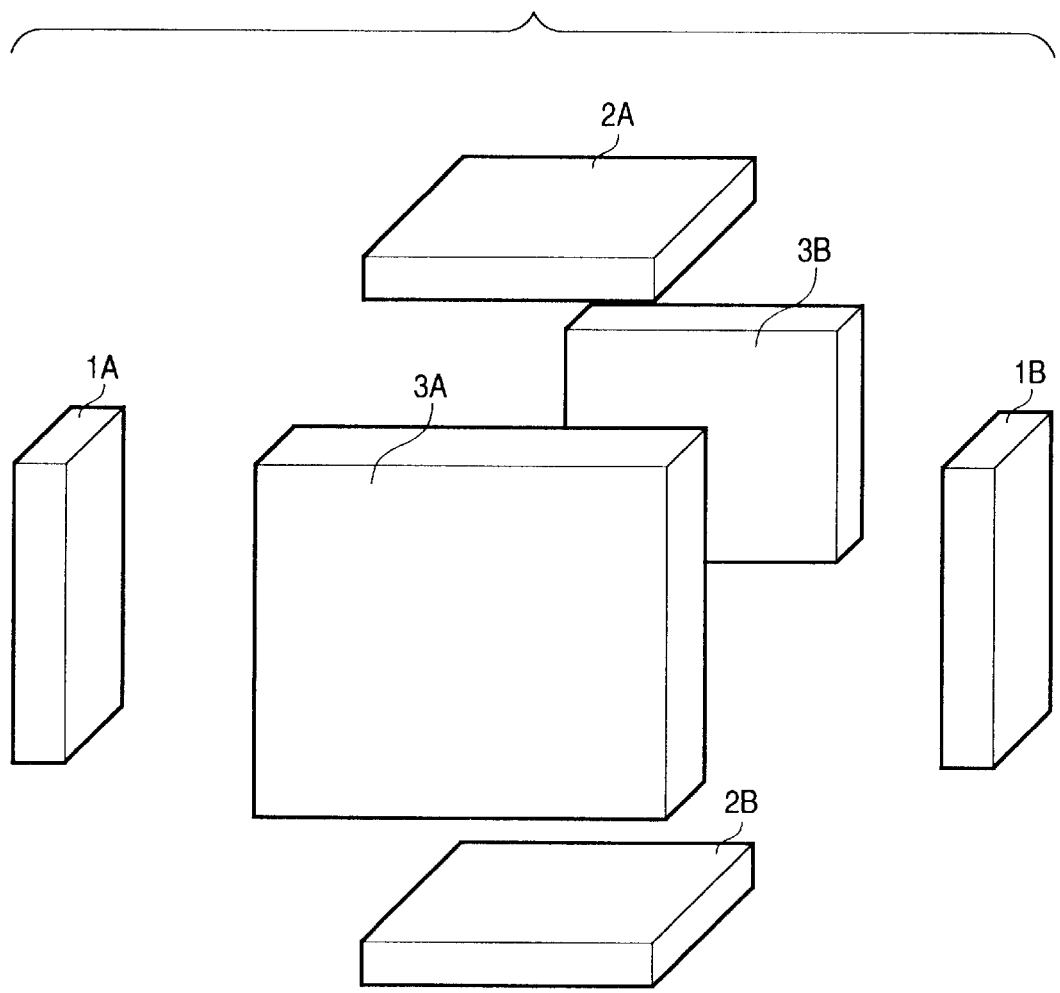
FIG. 4 is a view showing an arrangement of three pairs of sputtering cathodes of the present invention.

FIG. 4 shows an arrangement example of three pairs of rectangular parallelopipedonal sputtering cathodes, i.e., a first pair of 1A and 1B, a second pair of 2A and 2B, and a third pair of 3A and 3B, in which the target sides of each pair face each other. A substrate to be coated is placed within the space surrounded by the six cathodes.

Figure 5:
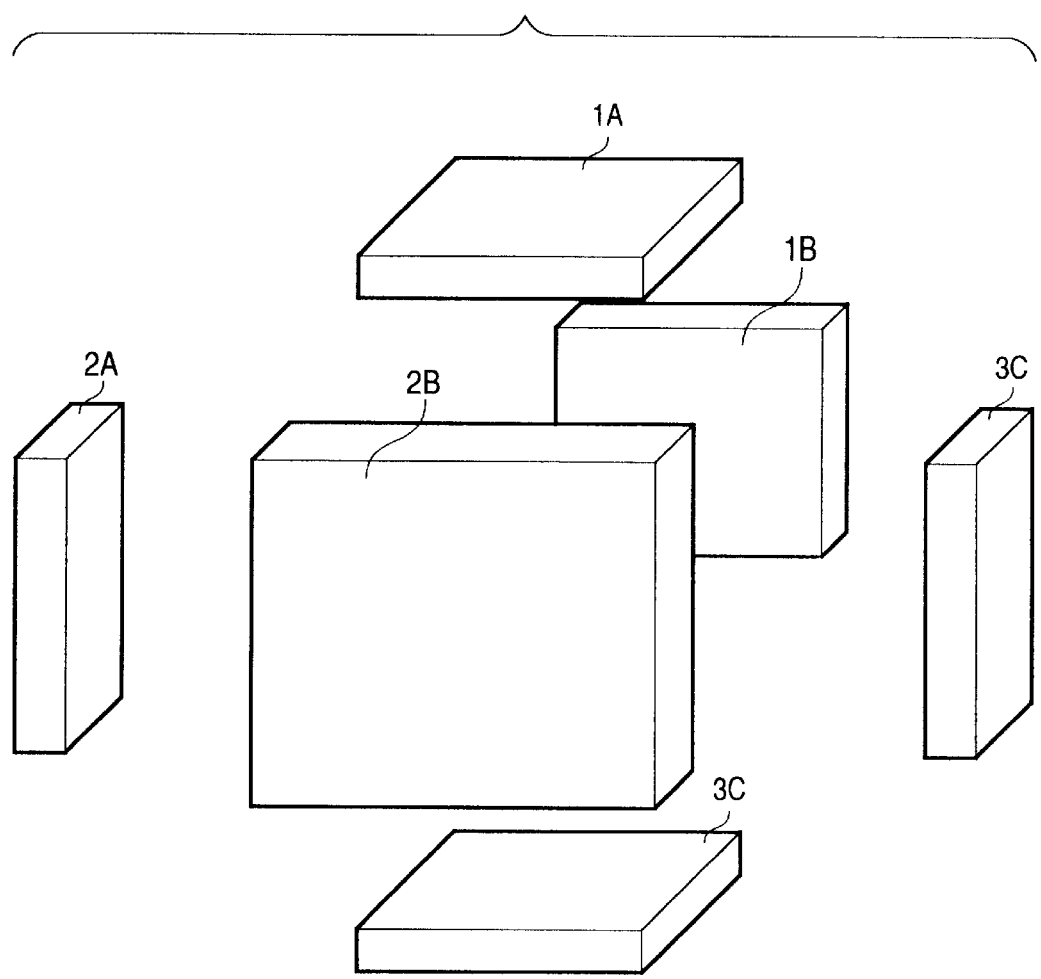
FIG. 5 is a view showing another arrangement of three pairs of sputtering cathodes of the present invention.

FIG. 5 shows another arrangement example of three pairs of rectangular parallelopipedonal sputtering cathodes. In this arrangement, each pair are set along two adjacent sides of the imaginary rectangular parallelepiped with their target sides facing inside, and a substrate to be coated is placed in the space surrounded by the six cathodes.

Figure 6:
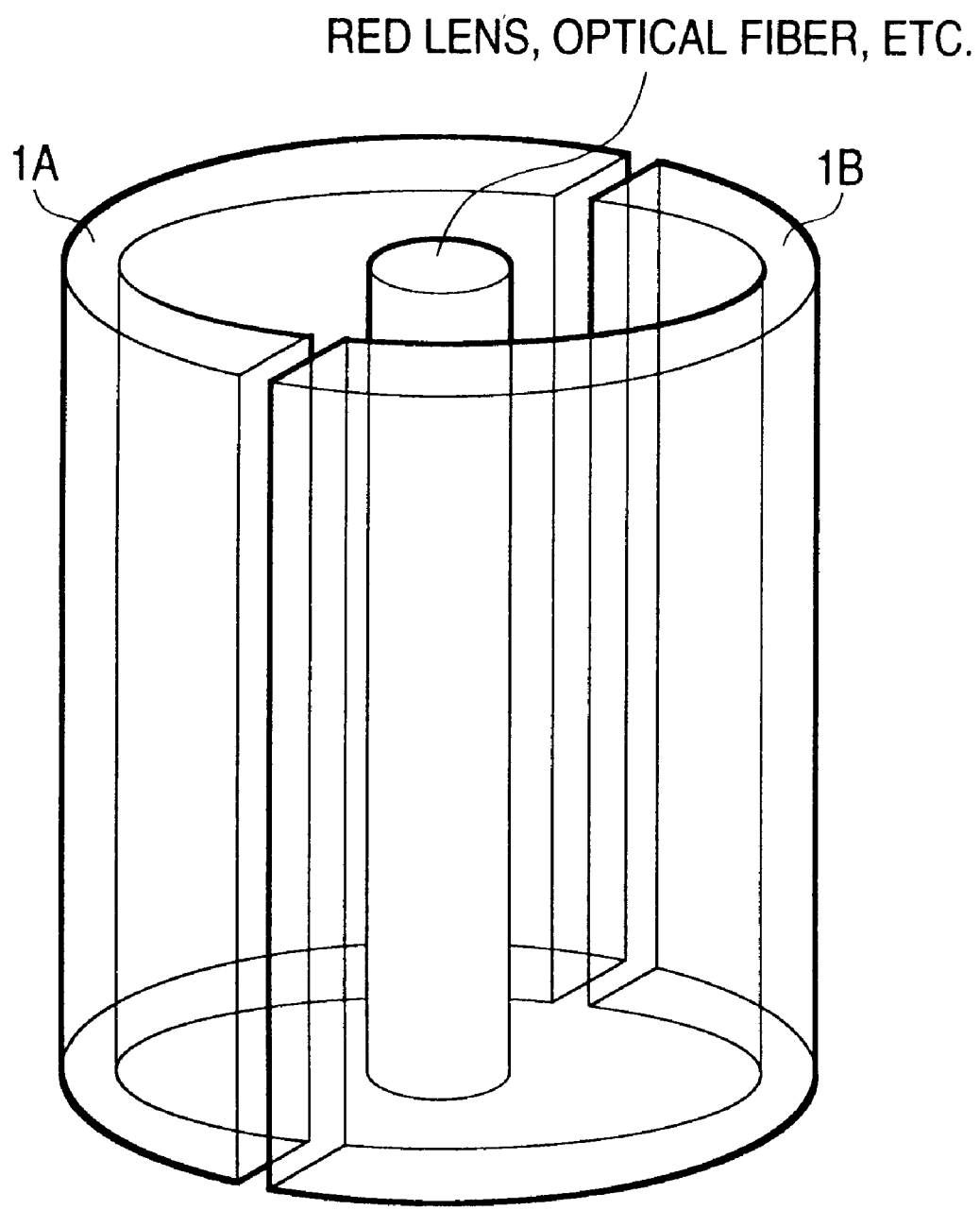
FIG. 6 is a perspective view showing another arrangement of a pair of sputtering cathodes of the present invention.

FIG. 6 is a perspective view showing a pair of half-cylindrical sputtering cathodes 1A and 1B, being arranged to make a cylindrical form together with their target sides facing inside. Magnets for inducing a magnetron discharge are not shown. In this embodiment, a rod-shaped substrate, such as a rod lens or an optical fiber, is placed at the center of the cylindrical space, and the fluxes of flying particles from the sputtered targets are deposited on the surface of the substrate to a uniform thickness.

The target material which can be used in the present invention includes metals, metal oxides, metal sulfides, and metal nitrides, for example, the metals or semiconductor elements of from the 3rd to 7th periods and of the groups 2A to 6B of the Periodic Table, e.g., indium, tin, zinc, gallium, antimony, aluminum, bismuth, titanium, zirconium, tantalum, niobium, lanthanum, cerium, silicon, etc. Those having electrical conductivity are preferred. From the viewpoint of discharge stability, the target preferably has a surface resistance of 10 k$\Omega$/square or less. Silicon, for example, can be made conductive by doping with a trace amount of boron, aluminum or phosphorus.

Conductive metal oxides, nitrides or oxynitrides are also useful target materials. Such conductive targets include a sintered mixed powder of titanium oxide and niobium oxide, a sintered mixed powder of indium oxide and tin oxide, and a sintered mixed powder of tin oxide and bismuth oxide.

Conductivity of the target comprising the above-described metal or semiconductor element can be improved by doping with a small amount of impurity, such as an element of the same period and of the group greater by one than the parent element as in the case of adding tin to indium to make ITO. Thus carriers are stably produced in the target to provide a stable glow discharge.

The present invention is applicable to formation of a metal film or a semiconductor film comprising the element of the above-described position in the Periodic Table. The present invention can also be put into practice like plasma-enhanced chemical vapor deposition. In this case, a material having a very low sputtering rate, such as titanium or stainless steel (SUS), is used as a target, and an organic gas, such as methane or an alcohol, is introduced into the vacuum chamber and made into plasma to form a diamond-like carbon (DLC) film or a diamond microcrystallite film on a substrate. In this application, too, a stable plasma discharge can be maintained even when a high density power is applied. That is, the plasma in the vicinity of the substrate has a high energy density so that a DLC film can be formed easily and rapidly.

Typical conditions of the coating according to the present invention are as follows.

Sputtering gas: Argon gas which may contain a small amount of oxygen is used in forming a metal oxide film by using a metal oxide as a target. A gas containing a large amount of a reactive gas such as oxygen or nitrogen is used in forming a metal oxide film or a metal nitride film by using a metal as a target.

Sputtering gas pressure: 1 to 50 mTorr

Substrate temperature: room temperature, or a substrate is heated appropriately.

Alternate inversion frequency: 1 to 100 kHz

Amplitude of voltage applied to cathode: 200 to 2000 V

The coating method using the planar magnetron cathodes shown in FIG. 1 is suitable for formation of a transparent conducting coating, an antistatic coating, an electromagnetic wave shield coating and an anti-reflection coating of medium to large-size flat displays, a transparent conducting coating or an anti-reflection coating of solar cells, and a heat-shield coating, an electromagnetic wave shield coating or an anti-reflection coating of window glass of buildings and vehicles. The kinds of coatings to which the present invention is suitably applied and their application are tabulated below.

| Coating | Application or Form of Coating |
| --- | --- |
| ITO | Display electrodes, antistatic, or electromagnetic wave shield coatings formed on both sides of a glass plate |
| $Si_3N_4$ | Formed on the entire periphery of tools or electronic parts |
| $SiO_2$ | Formed on the periphery of optical fibers or rod lenses, or formed on the entire periphery of glass ornaments |

-continued

| Coating | Application or Form of Coating |
| --- | --- |
| SiC | Formed on the entire periphery of heat-dissipation electronic parts |
| $TiO_2$ | Formed on the entire surface of products functioning as a photo catalyst |
| ZrN | Formed on the entire periphery of tools |
| $Al_2O_3$ | Formed on the entire periphery of tools or optical parts |
| AlN | Formed on the entire periphery of electronic part packages |
| DLC | Formed on the surface of cemented carbide tools |

According to the present invention, a coating comprising the target material can be formed on both sides of a flat plate-like substrate simultaneously or on substantially the entire surface of a bulky substrate. An insulating metal oxide coating can be formed by using the metal as a target by stable discharge plasma.

By use of the sputtering apparatus of the present invention, a coating can be formed on the entire surface of a substrate without rotating the substrate. Not requiring a means for rotating a substrate, the apparatus enjoys the advantages of simplification, which leads to cost reduction, and freedom of such problems as a vacuum leak, which improves the reliability of the coating.

While the invention has been described in detail and with reference to specific examples thereof, it will be apparent to one skilled in the art that various changes and modifications can be made therein without departing from the spirit and scope thereof.

What is claimed is:

1. In a method of forming a thin film on a substrate, which comprises:

setting one pair of sputtering cathodes in a film-forming chamber capable of controlling a vacuum atmosphere;

applying a voltage to the pair of the sputtering cathodes thereby alternately inverting the sputtering cathodes' polarities such that when one cathode functions as a cathode, another cathode functions as an anode, and when the another cathode functions as a cathode, the one cathode functions as an anode;

sputtering targets attached to the sputtering cathodes, the targets being sputtered by a glow discharge induced between the one pair of sputtering cathodes; and forming a coating on a substrate disposed substantially in front of the targets, the improvement wherein at least one pair of sputtering cathodes is set in the film-forming chamber, and the sputtering cathodes of each pair of sputtering cathodes are set on opposite sides or adjacent sides of an imaginary rectangular parallelepiped provided in the film-forming chamber such that their target sides face inside the imaginary rectangular parallelepiped, and the substrate is placed in the inside of a space formed by the imaginary rectangular parallelepiped, and further wherein a first pair of sputtering cathodes are arranged along two opposite sides of an imaginary rectangular parallelepiped provided in the film-forming chamber with their target sides facing each other, a second pair of sputtering cathodes are arranged along other two opposite sides of the imaginary rectangular parallelepiped with their target sides facing each other, and the substrate is placed in the inside of the imaginary rectangular parallelepiped.

2. The method as claimed in claim 1, wherein a third pair of sputtering cathodes are arranged along the third opposite sides of said imaginary rectangular parallelepiped with their target sides facing each other.

3. The method as claimed in claim 1, wherein three pairs of sputtering cathodes are used, each pair being arranged along two adjacent sides of an imaginary rectangular parallelepiped provided in said film-forming chamber with their target sides facing inside, and the substrate is placed inside said rectangular parallelepiped.

4. The method as claimed in claim 1, wherein all the sputtering cathodes have targets of the same composition attached thereto.

5. The method as claimed in claim 1, wherein the sputtering cathodes of one pair of sputtering cathodes are set on opposite sides of an imaginary rectangular parallelepiped provided in the film-forming chamber.

6. In a sputtering apparatus comprising a film-forming chamber equipped with a means capable of controlling vacuum atmosphere, a substrate support disposed in the film-forming chamber, one pair of sputtering cathodes having a target attached thereto, and a means for applying a voltage to the sputtering cathodes in a manner such that a polarity alternates between the sputtering cathodes making the pair induce a glow discharge to thereby sputter the target to form a coating comprising a target material on the surface of a substrate held on the substrate support, the improvement wherein at least one pair of sputtering cathodes is arranged in the film-forming chamber, and the sputtering cathodes of each pair of sputtering cathodes are arranged on opposite sides or adjacent sides of an imaginary rectangular parallelepiped provided in the film-forming chamber such that their target sides face inside the imaginary rectangular parallelepiped, and the substrate is placed in the inside of a space formed by the imaginary rectangular parallelepiped, and further wherein a first pair of sputtering cathodes are arranged along two opposite sides of an imaginary rectangular parallelepiped provided in the film-forming chamber with their target sides facing each other, a second pair of sputtering cathodes are arranged along other two opposite sides of the imaginary rectangular parallelepiped with their target sides facing each other, and the substrate is placed in the inside of the imaginary rectangular parallelepiped.

* * * * *